US009535338B2

(12) United States Patent
Jak et al.

(10) Patent No.: US 9,535,338 B2
(45) Date of Patent: Jan. 3, 2017

(54) METROLOGY METHOD AND APPARATUS, SUBSTRATE, LITHOGRAPHIC SYSTEM AND DEVICE MANUFACTURING METHOD

(71) Applicant: ASML Netherlands B.V., Veldhoven (NL)

(72) Inventors: Martin Jacobus Johan Jak, Eindhoven (NL); Armand Eugene Albert Koolen, Nuth (NL); Hendrik Jan Hidde Smilde, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 16 days.

(21) Appl. No.: 14/403,010

(22) PCT Filed: May 1, 2013

(86) PCT No.: PCT/EP2013/059061
§ 371 (c)(1),
(2) Date: Nov. 21, 2014

(87) PCT Pub. No.: WO2013/178422
PCT Pub. Date: Dec. 5, 2013

(65) Prior Publication Data
US 2015/0138523 A1 May 21, 2015

Related U.S. Application Data

(60) Provisional application No. 61/652,552, filed on May 29, 2012.

(51) Int. Cl.
*G03B 27/54* (2006.01)
*G03F 7/20* (2006.01)

(52) U.S. Cl.
CPC ....... *G03F 7/70483* (2013.01); *G03F 7/70625* (2013.01); *G03F 7/70633* (2013.01); *G03F 7/70683* (2013.01)

(58) Field of Classification Search
CPC .............. G03F 7/70483; G03F 7/70133; G03F 7/70633; G03F 7/70641
(Continued)

(56) References Cited

U.S. PATENT DOCUMENTS 7,230,703 B2 6/2007 Sezginer et al.
8,363,220 B2 1/2013 Coene et al.
(Continued)

FOREIGN PATENT DOCUMENTS

CN 101943572 A 1/2011
TW 201120580 A1 6/2011
(Continued)

OTHER PUBLICATIONS

International Search Report directed to related International Patent Application No. PCT/EP2013/059061, mailed Oct. 18, 2013; 6 pages.
(Continued)

*Primary Examiner* — Hung Henry Nguyen
(74) *Attorney, Agent, or Firm* — Sterne, Kessler, Goldstein & Fox P.L.L.C.

(57) ABSTRACT

A metrology target formed by a lithographic process on a substrate includes a plurality of component gratings. Images of the target are formed using +1 and −1 orders of radiation diffracted by the component gratings. Regions of interest (ROIs) in the detected image are identified corresponding the component gratings. Intensity values within each ROI are processed and compared between images, to obtain a measurement of asymmetry and hence overlay error. Separation zones are formed between the component gratings and design so as to provide dark regions in the image. In an embodiment, the ROIs are selected with their boundaries falling within the image regions corresponding to the separation zones. By this measure, the asymmetry measurement
(Continued)

is made more tolerant of variations in the position of the ROI. The dark regions also assist in recognition of the target in the images.

11 Claims, 6 Drawing Sheets

(58) Field of Classification Search
USPC .................................. 355/52, 53, 55, 67–71
See application file for complete search history.

(56) References Cited

U.S. PATENT DOCUMENTS

| | | | |
|---|---|---|---|
| 8,369,603 B2 | 2/2013 | Jeong et al. | |
| 8,867,020 B2* | 10/2014 | Smilde | G03F 7/70483 355/53 |
| 2009/0116014 A1 | 5/2009 | Smith et al. | |
| 2011/0027704 A1* | 2/2011 | Cramer | G03F 7/70641 430/30 |
| 2011/0043791 A1 | 2/2011 | Smilde et al. | |
| 2012/0013881 A1 | 1/2012 | Den Boef et al. | |
| 2012/0044470 A1 | 2/2012 | Smilde et al. | |
| 2012/0123581 A1 | 5/2012 | Smilde et al. | |
| 2012/0242970 A1 | 9/2012 | Smilde et al. | |
| 2013/0050501 A1 | 2/2013 | Warnaar et al. | |
| 2013/0059240 A1 | 3/2013 | Van Der Schaar et al. | |
| 2013/0258310 A1 | 10/2013 | Smilde et al. | |
| 2013/0271740 A1 | 10/2013 | Quintanilha | |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2012/062501 A1 | 5/2012 |
| WO | WO 2013/096656 A1 | 6/2013 |

OTHER PUBLICATIONS

International Preliminary Report on Patentability and Written Opinion of the International Searching Authority directed to related International Patent Application No. PCT/EP2013/059061, issued Dec. 2, 2014; 12 pages.

* cited by examiner

METROLOGY METHOD AND APPARATUS, SUBSTRATE, LITHOGRAPHIC SYSTEM AND DEVICE MANUFACTURING METHOD

CROSS-REFERENCE TO RELATED APPLICATIONS

This application claims the benefit of U.S. provisional application 61/652,552, which was filed on May 29, 2012 and which is incorporated herein in its entirety by reference.

BACKGROUND

Field of the Present invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. These targets can be smaller than the illumination spot and may be surrounded by product structures on a wafer. Multiple gratings can be measured in one image, using a composite grating target.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating, and asymmetry in an overlay grating can be used as an indicator of overlay error.

Because of the reduced size of the individual gratings in a composite grating target, edge effects (fringes) in the dark-field image become significant, and there can be cross-talk between the images of different gratings within the target. To address this issue, some select only a central portion of the image of each grating as a 'region of interest' (ROI). Only pixel values within the ROI are used to calculate asymmetry and overlay. As one considers ever smaller targets, however, the size of ROI that can be defined to be free of edge effects reduces to ever smaller numbers of pixels. Consequently the measurements are inherently more noisy, for a given acquisition time. Moreover, any variation in positioning the ROI becomes a significant source of error in the measured asymmetry.

SUMMARY

It is desirable to provide a technique for overlay metrology which maintains the benefits of using small gratings in composite target structures, in which accuracy can be improved over prior published techniques. A particular aim is to avoid the drawbacks associated with selecting smaller ROIs as target size decreases.

The present invention in a first embodiment provides a method of measuring a property of a lithographic process, using a composite target structure including a plurality of component structures that have been formed by the lithographic process on a substrate, the method comprising the steps of (a) forming and detecting an image of the composite target structure using a predetermined portion of radiation diffracted by the component target structures under predetermined illumination conditions, (b) identifying one or more regions of interest in the detected image, the or each region of interest corresponding to a specific one of the component target structures, and (c) processing pixel values within the region of interest to obtain a measurement of the property of the component structure. The composite target structure is formed with separation zones between the component structures so that a variation of a position of the one or more regions of interest does not significantly influence the obtained measurement of said property.

In some embodiments, the regions in the image corresponding to the separation zones are used to facilitate recognition of the target in the image.

In some embodiments, in step (c) the regions of interest are selected with their boundaries falling within the image regions corresponding to the separation zones. The structure in the separation zones can be formed so as to provide image regions that do not vary with the property being measured, so that the measurement is not so sensitive to variations in the exact positioning of the region of interest.

In some embodiments, the separation zones are formed to as to appear dark in the image, being formed for example with periodic structures having spatial frequencies much higher than those in the component structures.

The present invention in another embodiment provides an inspection apparatus for measuring a property of a lithographic process using a composite target structure including a plurality of component structures that have been formed by the lithographic process on a substrate, the apparatus comprising a support for the substrate having the composite target structure formed thereon, an optical system for illuminating the composite target structure under predetermined illumination conditions and for forming and detecting an image of the composite target structure using a predetermined portion of radiation diffracted by the component target structures under the illumination conditions, a processor arranged to identify one or more regions of interest in the detected image, the or each region of interest corresponding to a specific one of the component target structures and to process pixel values within the region of interest to obtain a measurement of the property of the component structure. The processor is arranged to identify the regions of interest such that their boundaries fall within image regions corresponding to separation zones between the component structures within the composite target structure.

The present invention in yet another embodiment provides inspection apparatus for measuring a property of a lithographic process using a composite target structure including a plurality of component structures that have been formed by the lithographic process on a substrate, the apparatus comprising a support for the substrate having the composite target structure formed thereon, an optical system for illuminating the composite target structure under predetermined illumination conditions and for forming and detecting an image of the composite target structure using a predetermined portion of radiation diffracted by the component target structures under the illumination conditions, a processor arranged to identify one or more regions of interest in the detected image, the or each region of interest corresponding to a specific one of the component target structures and to process pixel values within the region of interest to obtain a measurement of the property of the component structure. The processor is arranged to recognize the location of the composite target and identify the regions of interest at least in part by recognizing image regions corresponding to separation zones between the component structures within the composite target structure.

The present invention yet further embodiment provides a pair of patterning devices for use in forming a substrate according to any aspect of the present invention as set forth above, the patterning devices together being adapted for use in forming the composite target structure at one or more locations on a substrate. The patterning devices may be adapted for forming overlaid gratings in two different layers on a substrate, or they may be adapted for forming overlaid gratings in a layer by a 'multiple patterning' technique.

The present invention yet further embodiment provides a computer program product comprising machine-readable instructions for causing a processor to perform the identifying and processing steps (b) and (c) of a method according to the present invention as set forth above.

The present invention yet further embodiment provides a lithographic system comprising a lithographic apparatus arranged to transfer a sequence of patterns from patterning devices onto a substrate in an overlying manner; and an inspection apparatus according to the present invention as set forth above. The lithographic apparatus is arranged to use the calculated overlay values from the inspection apparatus in applying the sequence of patterns to further substrates.

A method of manufacturing devices wherein a sequence of device patterns is applied to a series of substrates in an overlying manner using a lithographic process, the method including inspecting at least one periodic structure formed as part of or beside the device patterns on at least one of the substrates using an inspection method according to the present invention as set forth above, and controlling the lithographic process for later substrates in accordance with the calculated overlay error.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 3A-3D comprise (a) a schematic diagram of a dark field scatterometer for use in measuring targets according to embodiments of the present invention using a first pair of illumination apertures, (b) a detail of diffraction spectrum of a target grating for a given direction of illumination (c) a second pair of illumination apertures providing further illumination modes in using the scatterometer for diffraction based overlay measurements and (d) a third pair of illumination apertures combining the first and second pair of apertures.

Figure 4:
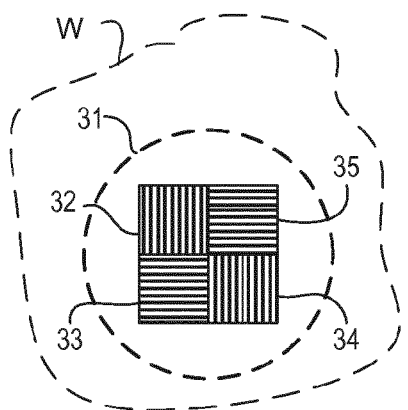

FIG. 4 depicts a known form of multiple grating target and an outline of a measurement spot on a substrate.

Figure 3:
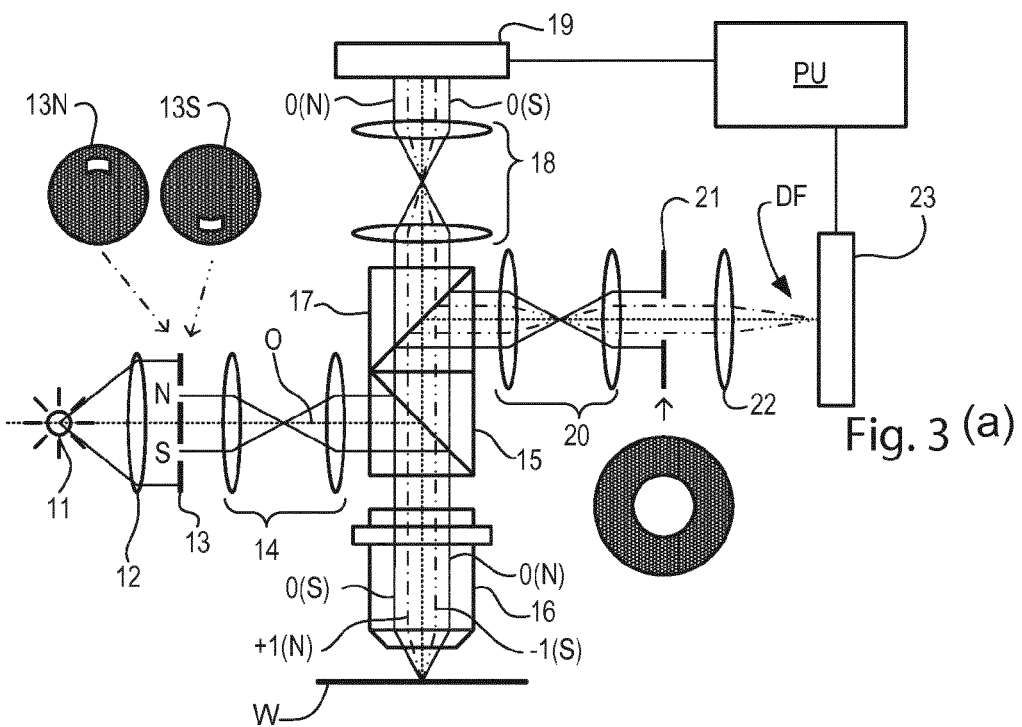
Figure 3:
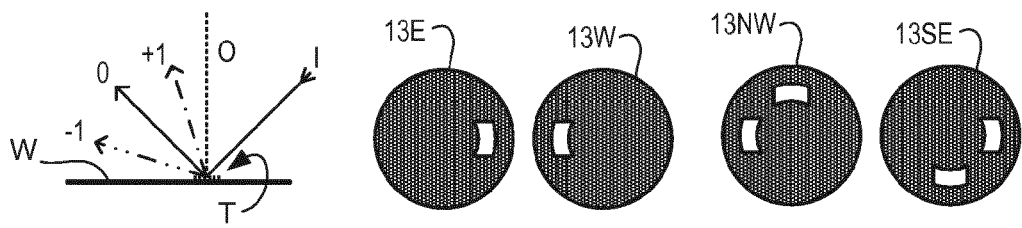
Figure 5:
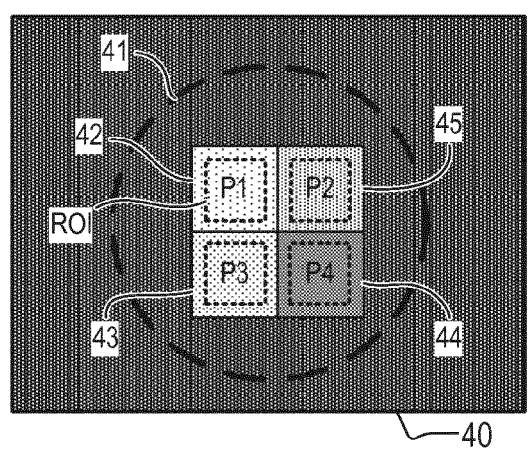

FIG. 5 depicts an image of the target of FIG. 4 obtained in the scatterometer of FIG. 3.

Figure 6:
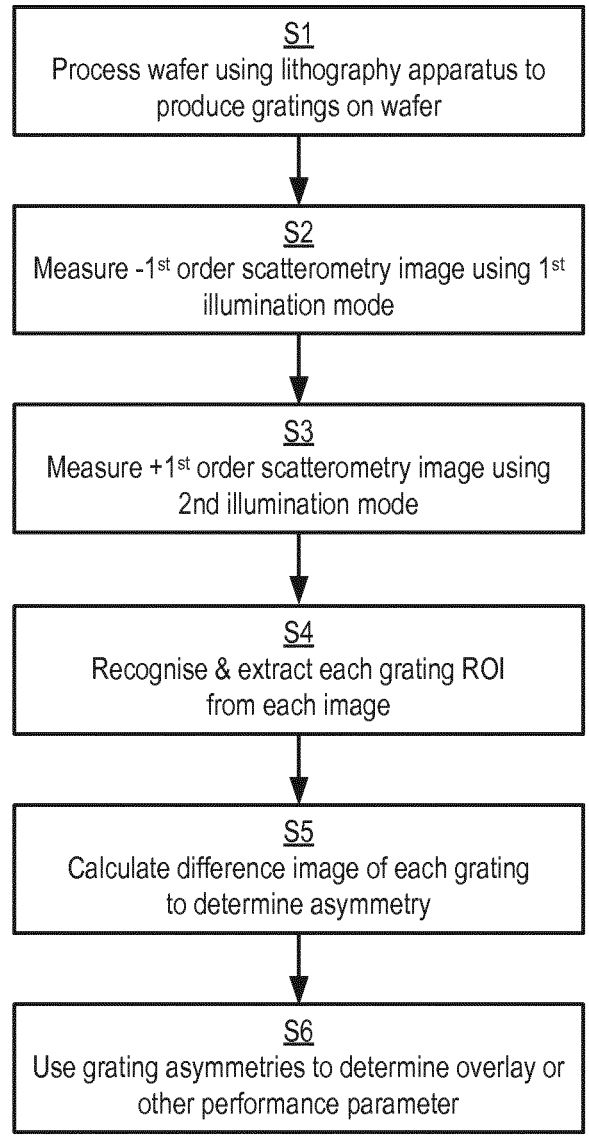

FIG. 6 is a flowchart showing the steps of an overlay measurement method using the scatterometer of FIG. 3 and adaptable to form an embodiment of the present invention.

Figure 7:
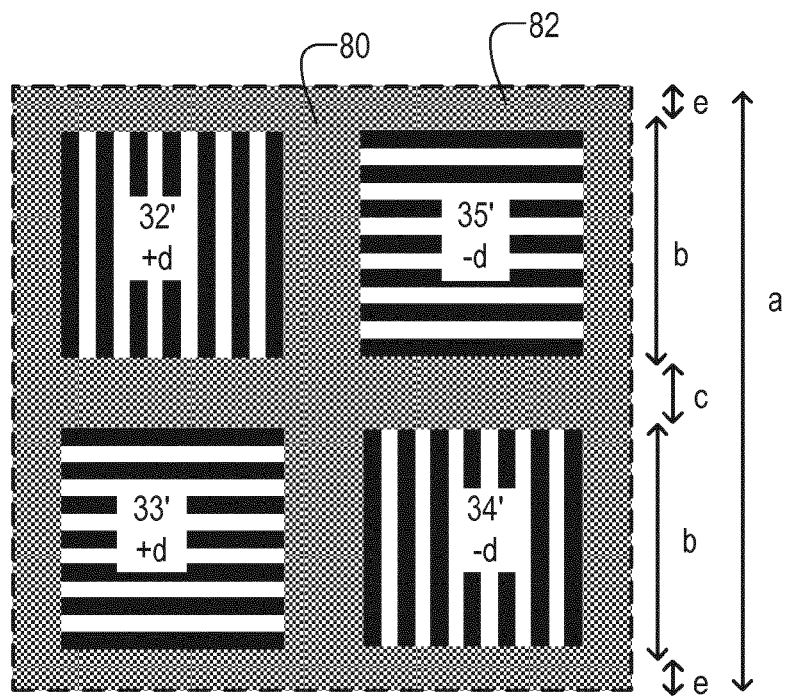

FIG. 7 illustrates a novel composite grating structure that can be used in embodiments of the present invention.

Figure 8:
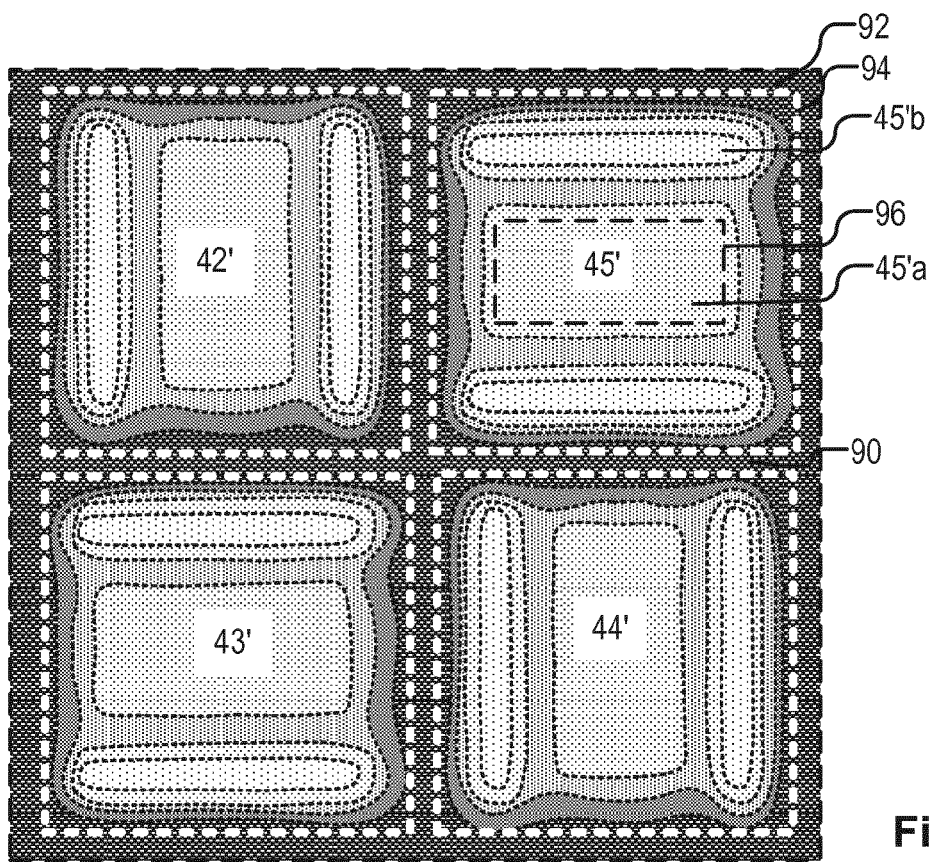

FIG. 8 illustrates a dark-field image of the structure of FIG. 7, and illustrates the selection of regions of interest in accordance with the an embodiment of the present invention.

Figure 9:
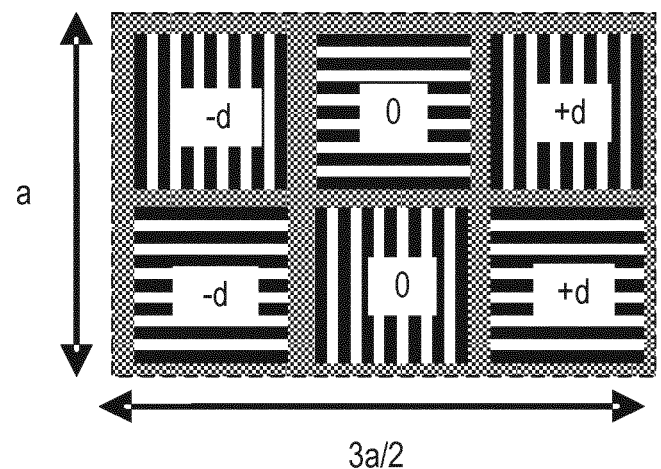
Figure 9:
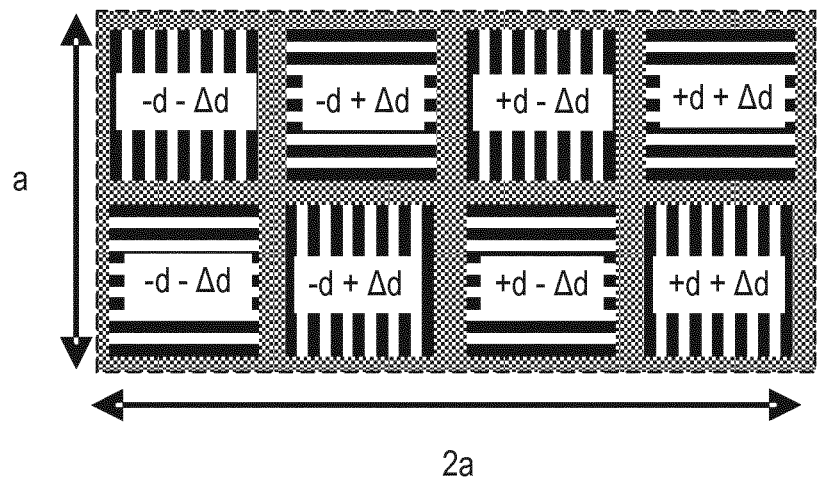
Figure 10:
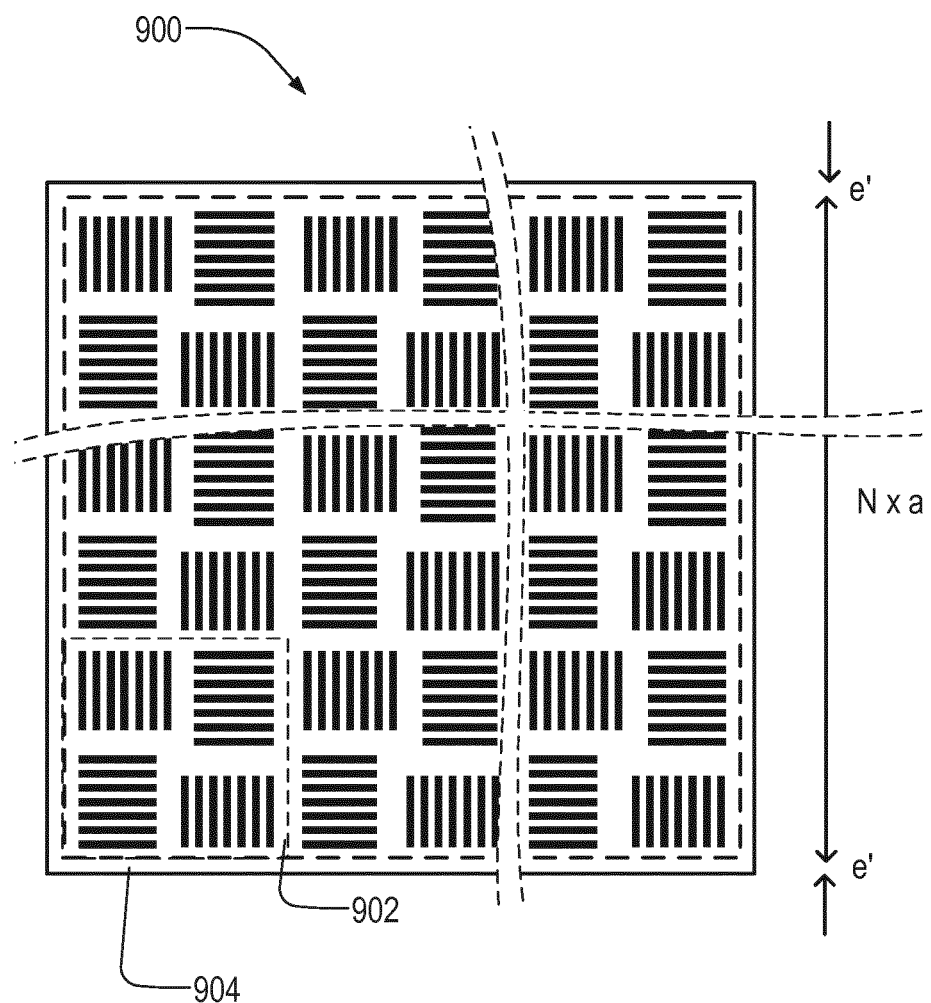

FIGS. 9A-9B illustrate two composite grating structures (a) and (b) having bias schemes that can be used in embodiments of the present invention, combining component gratings for two orthogonal directions of overlay measurement. and FIG. 10 shows an array of composite grating structures, for measurement of overlay between several layer pairs in a multilayer device structure being manufactured by lithography.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
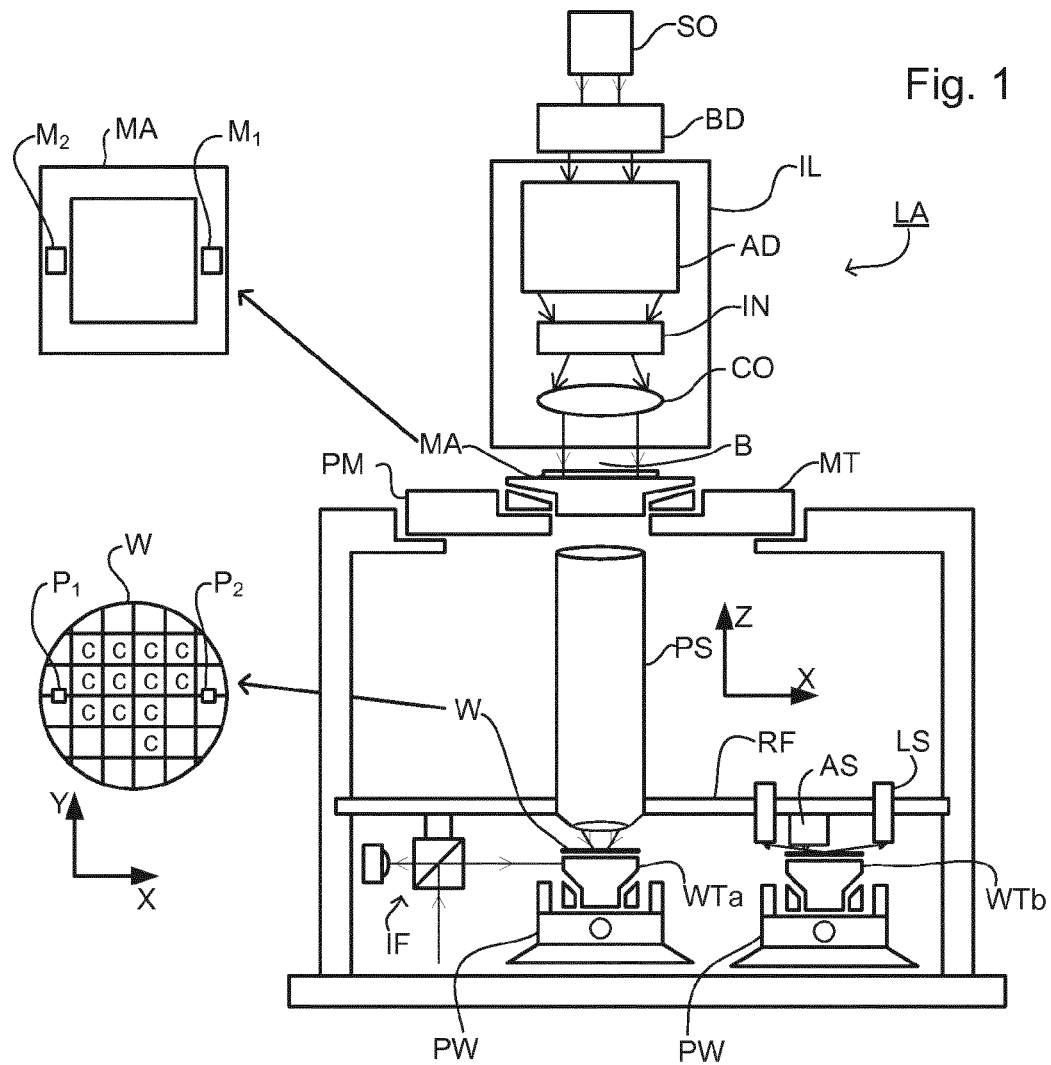
FIG. 1 depicts a lithographic apparatus according to an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
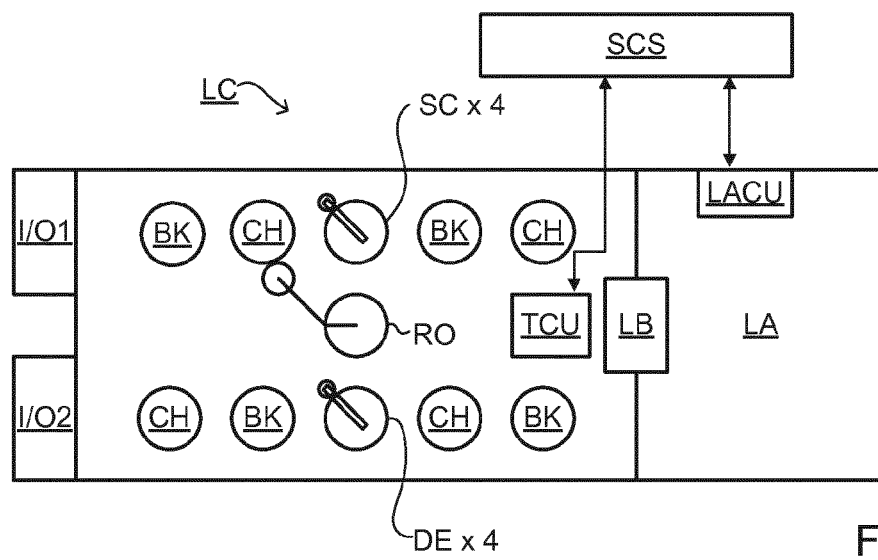
FIG. 2 depicts a lithographic cell or cluster according to an embodiment of the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Examples of dark field metrology can be found in international patent applications WO 2009/078708 and WO 2009/106279 which documents are hereby incorporated by reference in their entirety. Further developments of the technique have been described in published patent publications US20110027704A, US20110043791A, US20120044470 and US2012/0123581, and in the following US patent applications. The contents of all these applications are also incorporated herein by reference.

A dark field metrology apparatus suitable for use in embodiments of the present invention is shown in FIG. 3(a). A grating target T and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), grating target T is placed with substrate W normal to the optical axis O of objective lens 16. A ray of illumination I impinging on target T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target T and other features. Where a composite grating target is provided, each individual grating within the target will give rise to its own diffraction spectrum. Since the aperture in plate 13 has a finite width (necessary to admit a useful quantity of light, the incident rays I will in fact occupy a range of angles, and the diffracted rays and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the present invention, on-axis illumination of the targets is used, and an aperture stop with an off-axis aperture is used to pass substantially only one first order of diffracted light to the sensor. (The apertures shown at 13 and 21 are effectively swapped in that case.) In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial light modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

Overlay Measurement Using Small Targets

FIG. 4 depicts a composite grating target formed on a substrate according to known practice. The composite target comprises four individual gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The cross-hatched rectangle 40 represents the field of the image on the sensor, within which the illuminated spot 31 on the substrate is imaged into a corresponding circular area 41. Ideally the field is dark. Within this dark field image, rectangular areas 42-45 represent the images of the individual gratings 32 to 35. If the gratings are located in product areas, product features may also be visible in the periphery of this image field. While only a single composite grating target is shown in the dark field image of FIG. 5, in practice a semiconductor device or other product made by lithography may have many layers, and overlay measurements are desired to be made between different pairs of layers. For each overlay measurement between pair of layers, one or more composite grating targets are required, and therefore other composite grating targets may be present, within the image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the present invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

FIG. 6 illustrates how, using for example the method described in application US 2011/027704, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. Each grating will be represented simply by an area of a certain intensity level. The individual grating lines will not be resolved, because only one of the +1 and −1 order diffracted radiation is present. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

The present application discloses a new approach to target design and ROI selection, as will be described in more detail below, with reference to FIG. 7 onwards.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

In the prior applications, mentioned above, various techniques are disclosed for improving the quality of overlay measurements using the basic method mentioned above. For example, the intensity differences between images may be attributable to differences in the optical paths used for the different measurements, and not purely asymmetry in the target. The illumination source 11 may be such that the intensity and/or phase of illumination spot 31 is not uniform. Corrections can the determined and applied to minimize such errors, by reference for example to the position of the target image in the image field of sensor 23. The individual component gratings may be elongated in their direction of periodicity, so as to maximize the useful diffraction signals within a given target area. These techniques are explained in the prior applications, and will not be explained here in further detail. They may be used in combination with the techniques newly disclosed in the present application, which will now be described.

In another patent application (2857.315), features in and around edge portions of the individual gratings are modified so as to reduce the intensity and extent of edge effects. These modifications may work in a similar way to optical proximity correction (OPC) features used to enhance the printing of fine features in a lithographic process. In another application (2857.310), it is proposed to use three or more component gratings to measure overlay by the method of FIG. 6. By measuring asymmetries for gratings with at least three different biases, the calculations in step S6 can be modified so as to correct for feature asymmetry in the target gratings, such as is caused by bottom grating asymmetry in a practical lithographic process. These techniques similarly are explained in the prior applications, and will not be explained here in further detail. They may be used in combination with the techniques newly disclosed in the present application, which will now be described.

Edge Effects and ROI Selection

While FIG. 5 shows an idealized image with four squares 42-45 of uniform intensity, in practice, however, the image of each grating on the camera is not perfect. Due to the nature of the dark-field imaging, the edges of the target light up more brightly than the center part. This makes it difficult to measure "the" intensity of the target. Furthermore, light contribution from the neighboring grating, or the surrounding, needs to be avoided. In order to solve this problem currently a region of interest (ROI) is defined, which excludes the edges, and only selects light from the central part of each of the four component gratings. However, this means that effectively the signal is collected from a smaller area than the full size of the gratings. For example, where the individual gratings are 5×5 µm square, the ROI may correspond to only a 3×3 µm square area in the middle of the grating image. This decrease in signal either needs to be compensated with a longer acquisition time or results in a larger measurement uncertainty. Furthermore, correct placement of the ROI on the grating is extremely critical. A small shift will result in part of the edge light being included, which will lead to relatively large changes in the detected intensity and thus deteriorate measurement precision and accuracy further.

In this disclosure we propose a new target design. As a first benefit, the new target design can permit easier recognition of the target in the detected image. As a second benefit, when the new target is used in combination with a new ROI selection method the tolerance for the exact placement of the ROI can be improved. Potentially also the signal area can be increased, even as the size of the component gratings is being reduced.

A first novel feature of the proposed technique is to provide a separation area between the component gratings that make up the composite grating target. This separation can be made sufficiently large, that the intensity in between the images of the component targets is not significantly influenced by the component gratings, in spite of the presence of diffraction and edge fringes. The separation zones may be formed for example so that the intensity in those parts of the dark field image drops to substantially lower values, and appears dark. This facilitates the recognition of the composite target image and therefore the selection of the ROI. Example target designs will be presented below.

Additionally, the separation zones can be formed so that, should parts of them be included within the ROI, they provide no signal with respect to the property being measured. The composite target structure may be formed with separation zones between the component structures so that a variation of a position of one or more regions of interest does not significantly influence the measurement of the property. A second novel feature in some embodiments is in the way the resulting data is processed. In particular, there is a change in the way the region of interest (ROI) is selected in step S4 of the method steps shown in FIG. 6. In conjunction with use of the new target design, the ROI in the novel technique is chosen to be larger than the grating image, and deliberately includes all the fringes. The relatively large separation between the gratings allows the border of the ROI to extend through parts of the image corresponding to the separation zones. Because the separation zones are designed so as to provide no signal relevant to the measurement of interest, this reduces the sensitivity to the exact placement of the ROI. An easy way to make the separation zones provide no signal is to make them appear much darker than the component targets, as already mentioned. In principle, however, they do not need to appear dark, in order to have no influence on the measurement of the property of interest. For example, if pixel intensity values within the separation zone image regions are generally constant and insensitive to overlay variations, then the overlay measurement result will still be tolerant of variations in the exact placement of the ROI.

FIG. 7 shows a composite grating target of new design. As in the known target of FIG. 4, there are four rectangular (optionally square) component gratings, 32', 33', 34' and 35'. The form and layout of these gratings is similar to that of the gratings 32-35 in FIG. 4, but they are separated from one another and from their environment by separation zones 80 and 82. These separation zones are formed so as to form clear, dark regions in the dark field images detected by sensor 23. In order for the target to print and to process correctly, preferably the separation zones 80 and 82 are not completely blank, but filled with a 'dummy' structure. This dummy structure could be for example a grating with a much smaller pitch than the target gratings, but a comparable density. In this way the etch load (ratio of exposed to unexposed resist) of the dummy gratings is similar to that of the target gratings. Because of the much smaller pitch, the angle of +1 and −1 order diffraction from the dummy features is much greater than for the target gratings, so that light diffracted by the dummy structure will not pass the dark-field pupil stop and thus will not perturb the metrology measurement.

Assuming for simplicity that the composite grating target is square, representative dimensions a, b, c and e are marked to one side of the structure. Within a square of side a, component gratings with side b are separated by a separation zone 80 of width c. Separation zones 82 of width e surround the four component gratings. Assuming that the composite target will be arrayed with similar composite targets, dimension e can be smaller than dimension c, for example half the size. Rather than make the composite grating target larger to accommodate the separation zones, it is proposed that the gratings are reduced in size, to create the separation zones with no overall increase in the dimension a of the composite target.

As an example of possible dimensions, in one embodiment four gratings 32'-35' with dimension b=4 µm are placed in a composite target area with a=10 µm. The separation c between the gratings is 1 µm, and the separation e between a grating and the surroundings is 0.5 µm. If such targets are placed side by side (as illustrated in FIG. 11) this results in a 1 µm separation between gratings within different composite targets. The pitches of the gratings may be for example in the range 350-1050 µm. For a simple grating printed in overlaid layers, the line width within the grating is typically 50% of the pitch, though this is not essential. For example the pitch may be 500 nm (0.5 µm), with line widths for example 250 nm. As another example, the pitch may be 600 nm (0.6 µm). The optimum pitch will be a function of the apertures and pupil dimension, and the wavelengths of radiation to be used for the measurement. The skilled reader will know that the ideal line width can deviate from 50%, when optimized for linearity, signal strength and the like. Other forms of overlaid gratings are possible, not just within two layers. For example, two lithography steps may be applied to form a grating a single resist layer or product layer. In particular, in a double patterning process, multiple lithography and/or processing steps are applied to provide interleaved features of smaller pitch than can be formed using a single lithography step. In each reticle, the line width of the lines may then be much smaller than 50% of the overall pitch. The overlay error and associated asymmetry then arise within a single resist layer or product layer, rather than between two layers. The measurement techniques described herein can be applied equally in that case. The term 'overlaid' gratings and 'overlay' are to be understood as covering gratings formed in a single resist layer or product layer by a multiple patterning (e.g., double patterning) process.

As is well known in the art, these metrology grating features may have dimensions be much larger than critical dimensions of product features in the device being manufactured. The wavelengths of light used for the measurements may be much longer than that used for the exposure in the lithographic apparatus. Within the separation zones, the dummy structures may have dimensions similar to the product features.

If needed, the separations c and e between the targets and the surroundings may be increased. To limit the total required area for the composite grating, the gratings may be reduced to for example b=3 µm. This will reduce the amount of signal from these gratings somewhat, but it should be recalled that the ROI is only 3×3 µm for a 5×5 µm grating, in the known techniques.

The smaller number of lines within the gratings makes the relative contribution of the edge-lines to the total grating area larger. Therefore, matching between the optical proximity correction-like (OPC-like) features applied to the grating, and with the dummy structures, needs to be taken into account, in order to optimize for correct first and last line printing. (In practice, the detailed form of the grating lines and dummy structures will be optimized at every target, according to the exposure conditions of that particular product layer.)

FIG. 8 illustrates schematically a dark field image corresponding to FIG. 5, for the target of FIG. 7 and using illumination from two orthogonal directions. A part of the image field 40' corresponding to the target of interest is illustrated within a dashed boundary rectangle. Areas 42' to 45' of the image field correspond to the individual grating targets. Compared with the idealized, homogeneous areas illustrated in FIG. 5, FIG. 8 shows more realistically the wide variations in intensity caused by edge effects. In the area 45', for example, we see a relatively uniform central area 45'a fringed by much brighter areas 45'b. Surrounding these elements of the grating image 45' are darker regions 90 and 92, corresponding to the separation zones 80 and 82 respectively in the grating target. We also see that, due to diffraction, the influence of each component grating extends outside the image area strictly corresponding to the component grating. However, the separation zones in the target are wide enough that the dark image regions 90 and 92 contain substantially no contribution from the component gratings. The dark regions 90 and 92 are naturally a little narrower than would be implied strictly by the dimensions of the separation zones. The necessary width of separation zone can be reduced somewhat if the edge effects and diffraction are well-controlled by modifications of the grating structure.

According to the new principles disclosed herein, a region of interest (ROI) bounded by the white dotted square 94 is selected that includes the entire grating image 45' and parts of the surrounding dark regions 90, 92. The boundaries of the ROI fall in region that are much darker than any of the image features of interest. Therefore any slight errors in placement of the ROI boundaries have very little impact on the measured intensity within the ROI as a whole. In the known technique, by contrast, a much smaller ROI such as that indicated by the black dashed rectangle 96 would have been chosen, trying to keep within the homogeneous area 45'a only. Because the boundaries of the rectangle 96 fall within relatively bright and inhomogeneous parts of the overall grating image 45', the measured intensity using the known ROI selection technique is highly sensitive to variations in the exact positioning of the rectangle or other boundary. Accuracy and repeatability of the measurements can become degraded, especially as one tries to shrink the targets into smaller spaces.

How dark the separation zones can be made to appear is a matter of design choice and compromise between constraints. For pattern-recognition purposes, it may be very convenient to have these regions as dark as possible. This will occur if the pitches of dummy structures in the separation zones are small enough such that the generated diffraction orders of these zone-structures are all filtered out, not transmitted to the camera. They will be blocked by field stop 21, and may even be blocked by objective 16. From the point of view of the measurement signal. It is important that the asymmetry in the intensity (difference between +1 and −1 order intensities) goes to zero, not necessarily the intensity itself. However, this "background" intensity should not have variations like a gradient or a left-right asymmetry such that ROI position errors again contribute to asymmetry in the signal. The safest way is therefore indeed to have intensities that are nominally zero in the separation regions.

A criterion for design in this regard could be that the intensity variation in the zones should be below 0.1% of the asymmetry signal. If the asymmetry signal is, for example, 10% of the intensity within the grating, then the variation in intensity throughout the separation zones should be below $10^{-4}$ of the intensity in the grating image area. Conversely, this is not a hard requirement, and without meeting this criterion the measurement may still be useable. One can say for example that the intensity variation in the image of the separation zones should be below 10%, optionally below 1%, or even below 0.1%.

Referring back to the numerical examples presented above, the dimension b of the component gratings may be for example 3 or 4 µm, while the ROI dimension corresponds to 4 or 5 µm. Thus in each direction the separation zones may occupy more than 5%, more than 10% or even more than 15% or 20% of the composite target dimension. Where the composite target is positioned next to another composite target on the substrate, the separation zones at the edges of these composite targets may be considered to overlap one another, for the purposes of measuring these percentage criteria. As mentioned above, measures can also be taken in designing the target to reduce the strength of the edge effects, and these measures are by no means excluded from use with the present technique.

FIGS. 9 (a) and (b) show alternative forms of composite grating target, having more than two gratings per orientation. Such targets can be used to implement overlay measurement with BGA correction, using the principles discussed in prior patent application U.S. 61/616,398, mentioned above. In FIG. 9(a) there are three X-direction gratings and three Y-direction gratings, within a rectangular area of dimension a by 3a/2. In FIG. 9 (b) there are four component gratings in each direction (total eight gratings), within a rectangular area of dimension a by 2a. As with the example of FIG. 7, separation zones are provided between and around the component gratings within the composite target area. The overlay bias schemes are indicated in FIG. 9. Target (a) has three gratings per direction with the biases +d, 0, −d. Target (b) has four gratings with different permutations of bias value d and a sub-bias value Δd. The distinction between bias and sub-bias values is a matter of convenient notation. The biases for the four gratings in target (b) can be rewritten as ±$d_1$, ±$d_2$, where ±$d_1$=±(d−Δd), and ±$d_2$=±(d+Δd).

In the examples of FIG. 9, the X and Y gratings with each bias value are side-by-side, though that is not essential. The X- and Y-direction gratings are interspersed with one another in an alternating pattern, so that different X gratings are diagonally spaced, not side-by-side with one another, and Y gratings are diagonally spaced, not side-by-side with one another. This arrangement may help to reduce cross-talk between diffraction signals of the different biased gratings. The whole arrangement thus allows a compact target design, without good performance.

The increased spacing between component gratings, and the resultant dark regions between grating images in the dark field image of the target, make it easier to recognize the location of the grating images and identify the ROIs. In the examples described above and illustrated in FIGS. 7 to 9, all the gratings are square, and the intermediate space forms a normal cross. In another embodiment these gratings may be placed slightly off the square grid, or may be rectangular in shape in order to break the symmetry of the target. This may improve the accuracy & robustness of the pattern recognition algorithm that is used to find the targets in the images even further. Composite grating structures with elongate gratings are described for example in published patent application US20120044470.

FIG. 10 illustrates a number of composite grating targets laid out in a metrology area 900 on the substrate of a semiconductor device being manufactured using the lithographic and metrology apparatus of FIGS. 1 and 2. The metrology area may comprise a square array of N×N composite targets, of which one is illustrated within dashed square 902. Where each composite target occupies an area 10×10 μm, as in the example above, an array of 6×6 targets can be arranged in a metrology area of size 60×60 μm. This metrology area may be within a scribe lane between product areas C on substrate W, and it may be within a product area. Assuming each composite target has separation zones with dimensions similar to those in FIG. 7, an outer separation zone 904 of width e' is added, to ensure a desired minimum separation between the target gratings and surrounding product features. Note that the separation zones in FIG. 10 are left white just for clarity. In practice they will be filled with dummy structures in the same manner as the previous embodiments.

The skilled reader will appreciate that all of the gratings shown in FIG. 10 would not be present in the same layer pairs of the semiconductor or other product. Rather, one of the composite targets will exist in the patterns of two layers whose relative alignment (overlay) is to be measured. For those two layers a respective pair of patterning devices, such as reticles, will be formed with grating lines and associated features in the appropriate positions, and with the positions of those grating lines offset in accordance with the desired bias scheme. The positions for other composite targets in the area 900 will be left blank for use in other layers. Dummy features may be included in such 'blank' areas, to avoid crosstalk between layers. As mentioned already, features can be designed into the targets to facilitate pattern recognition. In the illustration of FIG. 10, X and Y direction gratings are elongated slightly in X and Y directions. This breaks somewhat the symmetry of the overall pattern, making it less likely that the dark field image areas will be mis-recognized in step S4 of the measurement method. Instead or in addition to breaking the symmetry in this way, special markers could be placed within the separation zones, to aid recognition.

Conclusion

The technique disclosed herein enable the design and use of small metrology targets to achieve great accuracy and repeatability of overlay measurements. Particular benefits that may be realized in a particular implementation include: reduced ROI positioning sensitivity, therefore better repeatability of measurements; reduced focus-sensitivity due to increased space between the gratings, leading to more accurate overlay values and/or greater throughput; reduced grating-to-grating cross-talk due to larger space between the gratings leading to more accurate overlay values; pattern-recognition improved due to better recognizable target imaged with dark separation zones; larger ROI meaning larger effective area for the measurement of pixel intensities, yielding better reproducibility.

The technique is compatible with other techniques in small target diffraction based overlay measurement, that have been described in the recent published and unpublished patent applications mentioned above. For example, using composite targets with three or more different bias values per direction, calculations can yield a BGA-corrected overlay measurement without the need for modeling the top & bottom gratings or any intervening layers such as BARC (antireflective coating).

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the present invention can be implemented by the provision of updated computer program products for causing a processor to perform the modified step S4 and so calculate overlay error with reduced sensitivity to ROI positioning errors. The program may optionally be arranged to control the optical system, substrate support and the like to perform the steps S2-S5 for measurement of asymmetry on a suitable plurality of target structures.

Further embodiments according to the invention are provided in below numbered clauses:

1. A method of measuring a property of a lithographic process, using a composite target structure including a plurality of component structures that have been formed by the lithographic process on a substrate, the method comprising the steps of:
   (a) forming and detecting an image of the composite target structure using a predetermined portion of radiation diffracted by the component target structures under predetermined illumination conditions;
   (b) identifying one or more regions of interest in the detected image, the or each region of interest corresponding to a specific one of the component target structures; and
   (c) processing pixel values within the region of interest to obtain a measurement of the property of the component structure,
   wherein the composite target structure is formed with separation zones between the component structures so that a variation of a position of the one or more regions of interest does not significantly influence the obtained measurement of said property.
2. A method of clause 1 wherein in step (c) the regions of interest are selected with their boundaries falling within the image regions corresponding to the separation zones.
3. A method of clause 1 or 2 wherein the component structures comprise overlaid gratings, and wherein different component structures within the composite target are formed with different overlay bias values.
4. A method of clause 3 wherein the component structures comprise overlaid gratings, and wherein different component structures within the composite target are formed with different orientations to measure overlay in different directions.
5. A method of clause 1, 2, 3 or 4 wherein two or more images of the composite target structure are detected using different portions of the diffracted radiation, and wherein step (e) comprises comparing the pixel values from corresponding regions of interest identified in the images to obtain a measurement of asymmetry of the one or more component structures.
6. A method of any preceding clause wherein in the steps (b) and (c) regions of interest corresponding to at least two component structures are identified in the same detected image and their pixel values are processed separately.

7. A method of any preceding clause wherein the separation zones occupy more than 5%, optionally more than 10% or more than 15% of the composite structure in a given direction.
8. A method of any preceding clause wherein the separation zones in the composite target structure contain filling structures having an average density similar to that of the component structures but with higher spatial frequencies, whereby radiation diffracted by the filling structures falls outside the portion of radiation used in the formation of the detected image.
9. An inspection apparatus for measuring a property of a lithographic process using a composite target structure including a plurality of component structures that have been formed by the lithographic process on a substrate, the apparatus comprising:
   a support for the substrate having the composite target structure formed thereon;
   an optical system for illuminating the composite target structure under predetermined illumination conditions and for forming and detecting an image of the composite target structure using a predetermined portion of radiation diffracted by the component target structures under the illumination conditions;
   a processor arranged to identify one or more regions of interest in the detected image, the or each region of interest corresponding to a specific one of the component target structures and to process pixel values within the region of interest to obtain a measurement of the property of the component structure,
      wherein the processor is arranged to identify the regions of interest such that their boundaries fall within image regions corresponding to separation zones between the component structures within the composite target structure.
10. An apparatus of clause 9 wherein the component structures comprise overlaid gratings formed in two layers on the substrate, and wherein different component structures within the composite target are formed with different overlay bias values.
11. An apparatus of clause 9 or 10 wherein the optical system is arranged to form and detect two or more images of the same composite target structure using different portions of the diffracted radiation, and wherein the processor is arranged to compare pixel values from corresponding regions of interest identified in the two images to obtain a measurement of asymmetry of the one or more component structures.
12. An apparatus of clause 9, 10 or 11 wherein the processor is arranged to identify regions of interest corresponding to at least two component structures in the same detected image and to process their pixel values together to obtain the measurement in accordance with a known bias scheme of the composite target.
13. A substrate for use in a method according to any of clauses 1 to 8, the substrate having at least one composite target structure comprising a plurality of component structures formed on the substrate by a lithographic process, wherein the composite target structure is formed with separation zones between the component structures, wherein within the separation zones the composite target structure is formed so as to appear dark in a dark field image of the component structures.
14. A substrate of clause 13 wherein the separation zones occupy more than 5%, optionally more than 10% or more than 15% of the composite structure in a given direction.
15. A substrate of clause 13 or 14 wherein a plurality of composite target structures are formed in different layers corresponding to layers of a manufactured device pattern, each composite target structure containing component structures in the form of overlaid gratings with different overlay bias values and different orientations.
16. A computer program product comprising machine-readable instructions for causing a processor to perform the identifying and processing steps (b) and (c) of a method of any of clauses 1 to 8 above.
17. An inspection apparatus for measuring a property of a lithographic process using a composite target structure including a plurality of component structures that have been formed by the lithographic process on a substrate, the apparatus comprising:
   a support for the substrate having the composite target structure formed thereon;
   an optical system for illuminating the composite target structure under predetermined illumination conditions and for forming and detecting an image of the composite target structure using a predetermined portion of radiation diffracted by the component target structures under the illumination conditions;
   a processor arranged to identify one or more regions of interest in the detected image, the or each region of interest corresponding to a specific one of the component target structures and to process pixel values within the region of interest to obtain a measurement of the property of the component structure,
      wherein the processor is arranged to recognize the location of the composite target and identify the regions of interest at least in part by recognizing image regions corresponding to separation zones between the component structures within the composite target structure.
18. A lithographic system comprising:
   a lithographic apparatus comprising:
      an illumination optical system arranged to illuminate a pattern;
      a projection optical system arranged to project an image of the pattern onto a substrate; and
      an inspection apparatus according to any of clauses 9 to 12 or 17, wherein the lithographic apparatus is arranged to use the measurement results from the inspection apparatus in applying the pattern to further substrates.
19. A method of manufacturing devices wherein a device pattern is applied to a series of substrates using a lithographic process, the method including inspecting at least one composite target structure formed as part of or beside the device pattern on at least one of the substrates using an inspection method of any of clauses 1 to 8 and controlling the lithographic process for later substrates in accordance with the result of the inspection method.
20. A method comprising:
   detecting an image of a composite target structure using a predetermined portion of radiation diffracted by component structures under predetermined illumination conditions;
   identifying one or more regions of interest in the detected image, the or each region of interest corresponding to a specific one of the component structures; and
   processing pixel values within the region of interest to obtain a measurement of the property of the component structure,
      wherein the composite target structure is formed with separation zones between the component structures so that a variation of a position of the one or more regions of interest does not significantly influence the obtained measurement of said property.

21. The method of clause 20, wherein in the processing the regions of interest are selected with their boundaries falling within the image regions corresponding to the separation zones.

22. The method of clause 20, wherein the component structures comprise overlaid gratings, and wherein different component structures within the composite target are formed with different overlay bias values.

23. The method of clause 22, wherein the component structures comprise overlaid gratings, and different component structures within the composite target are formed with different orientations to measure overlay in different directions.

24. The method of clause 20, wherein two or more images of the composite target structure are detected using different portions of the diffracted radiation, and the method further comprises comparing the pixel values from corresponding regions of interest identified in the images to obtain a measurement of asymmetry of the one or more component structures.

25. The method of clause 20, wherein in the identifying and processing, regions of interest corresponding to at least two component structures are identified in the same detected image and their pixel values are processed separately.

26. The method of clause 20, wherein the separation zones occupy more than 5%, more than 10% or more than 15% of the composite structure in a given direction.

27. The method of clause 20, wherein the separation zones in the composite target structure contain filling structures having an average density similar to that of the component structures but with higher spatial frequencies, whereby radiation diffracted by the filling structures falls outside the portion of radiation used in the formation of the detected image.

28. An inspection apparatus comprising:
a support configured to support a substrate having a composite target structure formed thereon;
an optical system configured to illuminate the composite target structure under predetermined illumination conditions and configured to form and detecting an image of the composite target structure using a predetermined portion of radiation diffracted by component structures under the illumination conditions; and
a processor arranged to identify one or more regions of interest in the detected image, the or each region of interest corresponding to a specific one of the component structures and to process pixel values within the region of interest to obtain a measurement of the property of the component structure,
wherein the processor is arranged to identify the regions of interest such that their boundaries fall within image regions corresponding to separation zones between the component structures within the composite target structure.

29. The apparatus of clause 28, wherein:
the component structures comprise overlaid gratings formed in two layers on the substrate, and different component structures within the composite target are formed with different overlay bias values.

30. The apparatus of clause 28, wherein:
the optical system is arranged to form and detect two or more images of the same composite target structure using different portions of the diffracted radiation, and the processor is arranged to compare pixel values from corresponding regions of interest identified in the two images to obtain a measurement of asymmetry of the one or more component structures.

31. The apparatus of clause 28, wherein the processor is arranged to identify regions of interest corresponding to at least two component structures in the same detected image and to process their pixel values together to obtain the measurement in accordance with a known bias scheme of the composite target.

32. A substrate comprising:
at least one composite target structure comprising a plurality of component structures formed on the substrate by a lithographic process,
wherein the composite target structure is formed with separation zones between the component structures,
wherein within the separation zones the composite target structure is formed so as to appear dark in a dark field image of the component structures.

33. The substrate of clause 32, wherein the separation zones occupy more than 5%, more than 10% or more than 15% of the composite structure in a given direction.

34. The substrate of clause 32, wherein a plurality of composite target structures are formed in different layers corresponding to layers of a manufactured device pattern, each composite target structure containing component structures in the form of overlaid gratings with different overlay bias values and different orientations.

35. A computer readable medium having stored thereon computer-executable instructions, execution of which by a computing device causes the computing device to perform operations comprising:
detecting an image of a composite target structure using a predetermined portion of radiation diffracted by component structures under predetermined illumination conditions;
identifying one or more regions of interest in the detected image, the or each region of interest corresponding to a specific one of the component structures; and
processing pixel values within the region of interest to obtain a measurement of the property of the component structure,
wherein the composite target structure is formed with separation zones between the component structures,
wherein within the separation zones the composite target structure is formed so as to provide regions in the image detected that are not significantly influenced by radiation diffracted by the component structures.

36. An inspection apparatus comprising:
a support configured to support a substrate having a composite target structure formed thereon;
an optical system configured to illuminate the composite target structure under predetermined illumination conditions and to form and detect an image of the composite target structure using a predetermined portion of radiation diffracted by component structures under the illumination conditions; and
a processor arranged to identify one or more regions of interest in the detected image, the or each region of interest corresponding to a specific one of the component structures and to process pixel values within the region of interest to obtain a measurement of the property of the component structure,
wherein the processor is arranged to recognize the location of the composite target and identify the regions of interest at least in part by recognizing image regions corresponding to separation zones between the component structures within the composite target structure.

37. A lithographic system comprising:
a lithographic apparatus comprising:
an illumination optical system arranged to illuminate a pattern;
a projection optical system arranged to project an image of the pattern onto a substrate; and
an inspection apparatus comprising,
a support configured to support a substrate having a composite target structure formed thereon;
an optical system configured to illuminate the composite target structure under predetermined illumination conditions and configured to form and detecting an image of the composite target structure using a predetermined portion of radiation diffracted by component structures under the illumination conditions; and
a processor arranged to identify one or more regions of interest in the detected image, the or each region of interest corresponding to a specific one of the component structures and to process pixel values within the region of interest to obtain a measurement of the property of the component structure,
wherein the processor is arranged to identify the regions of interest such that their boundaries fall within image regions corresponding to separation zones between the component structures within the composite target structure;
wherein the lithographic apparatus is arranged to use the measurement results from the inspection apparatus in applying the pattern to further substrates.

38. A method of manufacturing devices comprising:
applying a pattern to a series of substrates using a lithographic process;
inspecting at least one composite target structure formed as part of or beside the device pattern on at least one of the substrates using an inspection method comprising,
detecting an image of a composite target structure using a predetermined portion of radiation diffracted by component structures under predetermined illumination conditions;
identifying one or more regions of interest in the detected image, the or each region of interest corresponding to a specific one of the component structures; and
processing pixel values within the region of interest to obtain a measurement of the property of the component structure,
wherein the composite target structure is formed with separation zones between the component structures,
wherein within the separation zones the composite target structure is formed so as to provide regions in the image detected that are not significantly influenced by radiation diffracted by the component structures; and
controlling the lithographic process for later substrates in accordance with the result of the inspection method.

39. A method of measuring a property of a lithographic process, using a composite target structure including a plurality of component structures that have been formed by the lithographic process on a substrate, the method comprising the steps of:
(a) forming and detecting an image of the composite target structure using a predetermined portion of radiation diffracted by the component target structures under predetermined illumination conditions;
(b) identifying one or more regions of interest in the detected image, the or each region of interest corresponding to a specific one of the component target structures; and
(c) processing pixel values within the region of interest to obtain a measurement of the property of the component structure,
wherein the composite target structure is formed with separation zones between the component structures, wherein within the separation zones the composite target structure is formed so as to provide regions in the image detected in step (b) that are not significantly influenced by radiation diffracted by the component structures.

40. A method comprising:
detecting an image of a composite target structure using a predetermined portion of radiation diffracted by component structures under predetermined illumination conditions;
identifying one or more regions of interest in the detected image, the or each region of interest corresponding to a specific one of the component structures; and processing pixel values within the region of interest to obtain a measurement of the property of the component structure,
wherein the composite target structure is formed with separation zones between the component structures,
wherein within the separation zones the composite target structure is formed so as to provide regions in the image detected that are not significantly influenced by radiation diffracted by the component structures.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a property of a lithographic process, using a composite target structure including a plurality of component structures that have been formed by the lithographic process on a substrate, the method comprising:
   detecting an image of the composite target structure using a predetermined portion of radiation diffracted by the plurality of component target structures under predetermined illumination conditions;
   identifying one or more regions in the detected image, each region corresponding to a respective one of the plurality of component structures; and
   processing pixel values within the one or more regions to obtain a measurement of the property of the lithographic process,
   wherein the composite target structure is formed with separation zones between the plurality of component structures and each region corresponding to the respective one of the plurality of component structures includes an entire image of the respective one of the plurality of component structures and part of an image of the separation zone.

2. The method of claim 1, wherein the plurality of component structures comprise overlaid gratings, and wherein different component structures within the composite target structure are formed with different overlay bias values.

3. The method of claim 2, wherein:
   the plurality of component structures comprise overlaid gratings, and
   wherein different component structures within the composite target structure are formed with different orientations to measure overlay in different directions.

4. The method of claim 1, wherein:
   two or more images of the composite target structure are detected using different portions of the diffracted radiation, and
   the processing comprises comparing the pixel values from corresponding regions identified in the images to obtain a measurement of asymmetry of the plurality of component structures.

5. The method of claim 1, wherein the identifying and the processing comprises:
   identifying regions corresponding to at least two component structures in the detected image; and
   processing pixel values within the regions corresponding to the at least two component structures separately.

6. The method of claim 1, wherein the separation zones occupy more than 5% of the composite target structure in a given direction.

7. The method of claim 1, wherein the separation zones in the composite target structure contain filling structures having an average density similar to that of the plurality of component structures but with higher spatial frequencies, whereby radiation diffracted by the filling structures falls outside the portion of radiation used in the formation of the detected image.

8. A non-transitory computer-readable storage medium having instructions stored thereon that, when executed by at least one computing device, causes the at least one computing device to perform operations comprising:
   detecting an image of a composite target structure including component target structures using a predetermined portion of radiation diffracted by the component target structures under predetermined illumination conditions;
   identifying one or more regions in the detected image, each region corresponding to a respective one of the component target structures; and
   processing pixel values within the one or more regions to obtain a measurement of property of a lithographic process,
   wherein the composite target structure is formed with separation zones between the component target structures and each region corresponding to the respective one of the component target structures includes an entire image of the respective one of the component target structures and part of an image of the separation zone.

9. A method of manufacturing devices wherein a device pattern is applied to a series of substrates using a lithographic process, the method comprising:
   inspecting at least one composite target structure formed as part of or beside the device pattern on at least one of the substrates using an inspection method comprising:
      detecting an image of the composite target structure including component target structures using a predetermined portion of radiation diffracted by the component target structures under predetermined illumination conditions;
      identifying one or more regions in the detected image, each region corresponding to a respective one of the component target structures; and processing pixel values within the one or more regions to obtain a measurement of a property of the lithographic process, wherein the composite target structure is formed with separation zones between the component target structures and each region corresponding to the respective one of the component target structures includes an entire image of the respective one of the component target structures and part of an image of the separation zone; and controlling the lithographic process for later substrates in accordance with the measured property of the lithographic process.

10. The method of claim 1, wherein the separation zones occupy more than 10% of the composite target structure in a given direction.

11. The method of claim 1, wherein the separation zones occupy more than 15% of the composite target structure in a given direction.

* * * * *